United States Patent
Kong et al.

(10) Patent No.: US 10,615,288 B1
(45) Date of Patent: Apr. 7, 2020

(54) INTEGRATION SCHEME FOR NON-VOLATILE MEMORY ON GATE-ALL-AROUND STRUCTURE

(71) Applicant: International Business Machines Corporation, Armonk, NY (US)

(72) Inventors: Dexin Kong, Guilderland, NY (US); Zhenxing Bi, Niskayuna, NY (US); Zheng Xu, Wappingers Falls, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/169,207

(22) Filed: Oct. 24, 2018

(51) Int. Cl.
*H01L 29/792* (2006.01)
*H01L 29/66* (2006.01)
(Continued)

(52) U.S. Cl.
CPC ...... *H01L 29/792* (2013.01); *H01L 27/11578* (2013.01); *H01L 29/0669* (2013.01);
(Continued)

(58) Field of Classification Search
CPC ..... B82Y 40/00; B82Y 10/00; H01L 29/0673; H01L 29/42392; H01L 29/66545; H01L 29/0665; H01L 51/0558; H01L 21/02603; H01L 27/1052; H01L 27/112; H01L 27/228; H01L 27/11; H01L 27/1211; H01L 29/41725; H01L 21/308; H01L 25/50;
(Continued)

(56) References Cited

U.S. PATENT DOCUMENTS 7,723,789 B2   5/2010   Lin et al.
8,541,274 B1   9/2013   Xie et al.
(Continued)

FOREIGN PATENT DOCUMENTS

WO   2011162725 A1   12/2011

OTHER PUBLICATIONS

List of IBM Patents or Patent Applications Treated as Related; (Appendix P), Filed Nov. 6, 2019; 2 pages.
(Continued)

*Primary Examiner* — Caleen O Sullivan
(74) *Attorney, Agent, or Firm* — Cantor Colburn LLP; Alvin Borromeo

(57) ABSTRACT

A integrated device including a non-volatile memory (NVM) and a nanosheet field effect transistor (FET) and a method of fabricating the device include patterning fins for a channel region of the NVM and the FET. The method also includes depositing an organic planarization layer (OPL) and a block mask to protect the fins for the channel region of the FET, conformally depositing a set of layers that make up an NVM structure in conjunction with the channel region of the NVM while protecting the fins for the channel region of the FET with the OPL and the block mask, and removing the OPL and the block mask protecting the fins for the channel region of the FET. Source and drain regions of the NVM and the FET are formed, and a gate of the FET is formed while protecting the NVM by depositing another OPL and another block mask.

10 Claims, 15 Drawing Sheets

(51) Int. Cl.
*H01L 29/06* (2006.01)
*H01L 27/11578* (2017.01)
*H01L 21/28* (2006.01)

(52) U.S. Cl.
CPC .. *H01L 29/40117* (2019.08); *H01L 29/66795* (2013.01); *H01L 29/66833* (2013.01)

(58) Field of Classification Search
CPC ..... H01L 27/14634; H01L 2224/73101; H01L 224/73201; H01L 21/28017; H01L 27/1122; H01L 45/1206; H01L 27/2463; H01L 27/2454; H01L 45/16; H01L 45/122; H01L 45/146; H01L 45/04; H01L 45/1226; H01L 45/1233; H01L 45/1675; H01L 29/792; H01L 29/40117; H01L 27/11578; H01L 29/0669; H01L 29/66795; H01L 29/66833; H01L 51/0048; Y10S 977/938; Y10S 977/84; Y10S 977/762
USPC ...................... 257/4, 324; 438/382
See application file for complete search history.

(56) References Cited

U.S. PATENT DOCUMENTS

| | | |
|---|---|---|
| 8,779,495 B2 | 7/2014 | Happ et al. |
| 8,890,121 B1 | 11/2014 | Han et al. |
| 8,975,095 B2 | 3/2015 | Han et al. |
| 9,076,686 B1 | 7/2015 | Karda et al. |
| 9,159,829 B1 | 10/2015 | Ramaswamy |
| 9,263,577 B2 | 2/2016 | Ramaswamy et al. |
| 9,276,092 B1 | 3/2016 | Karda et al. |
| 9,276,134 B2 | 3/2016 | Karda et al. |
| 9,305,929 B1 | 4/2016 | Karda et al. |
| 9,337,210 B2 | 5/2016 | Karda et al. |
| 9,450,024 B2 | 9/2016 | Karda et al. |
| 9,472,560 B2 | 10/2016 | Ramaswamy et al. |
| 9,559,118 B2 | 1/2017 | Karda et al. |
| 9,559,194 B2 | 1/2017 | Karda et al. |
| 9,608,111 B2 | 3/2017 | Ramaswamy |
| 9,673,203 B2 | 6/2017 | Karda et al. |
| 9,673,390 B2 | 6/2017 | Reed et al. |
| 9,761,715 B2 | 9/2017 | Ramaswamy et al. |
| 9,773,976 B2 | 9/2017 | Karda et al. |
| 9,853,211 B2 | 12/2017 | Sills et al. |
| 9,899,398 B1 | 2/2018 | Colinge et al. |
| 2008/0237575 A1 | 10/2008 | Jin et al. |
| 2010/0117138 A1 | 5/2010 | Huerta et al. |
| 2011/0058418 A1 | 5/2011 | Choi et al. |
| 2013/0270508 A1 | 10/2013 | Li et al. |
| 2017/0278842 A1* | 9/2017 | Song .................. H01L 29/0673 |
| 2019/0198629 A1* | 6/2019 | Yeung ............... H01L 29/66742 |

OTHER PUBLICATIONS

Dexin Kong et al., "Integration Scheme for Non-Volatile Memory on Gate-All-Around Structure", U.S. Appl. No. 16/675,391, filed Nov. 6, 2019.

List of IBM Patents or Patent Applications Treated as Related; (Appendix P), Filed Apr. 9, 2019; 2 pages.

Zhenxing Bi et al., "Co-Integration of Non-Volatile Memory on Gate-All-Around Field Effect Transistor", U.S. Appl. No. 16/286,843, filed Feb. 27, 2019.

Fu et al., "Trap layer engineered gate-all-around vertically stacked twin Si-nanowire nonvolatile memory", International Electron Devices Meeting, 2007, pp. 79-82.

\* cited by examiner

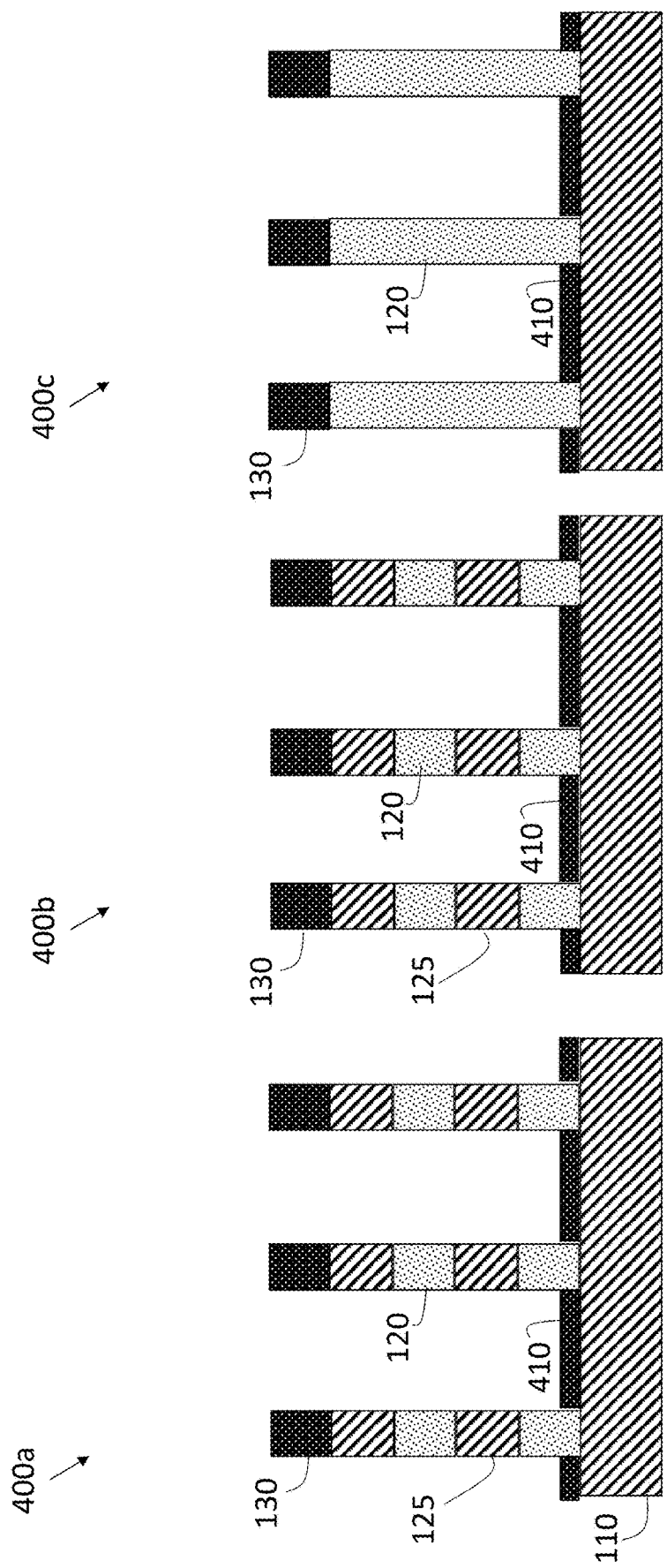

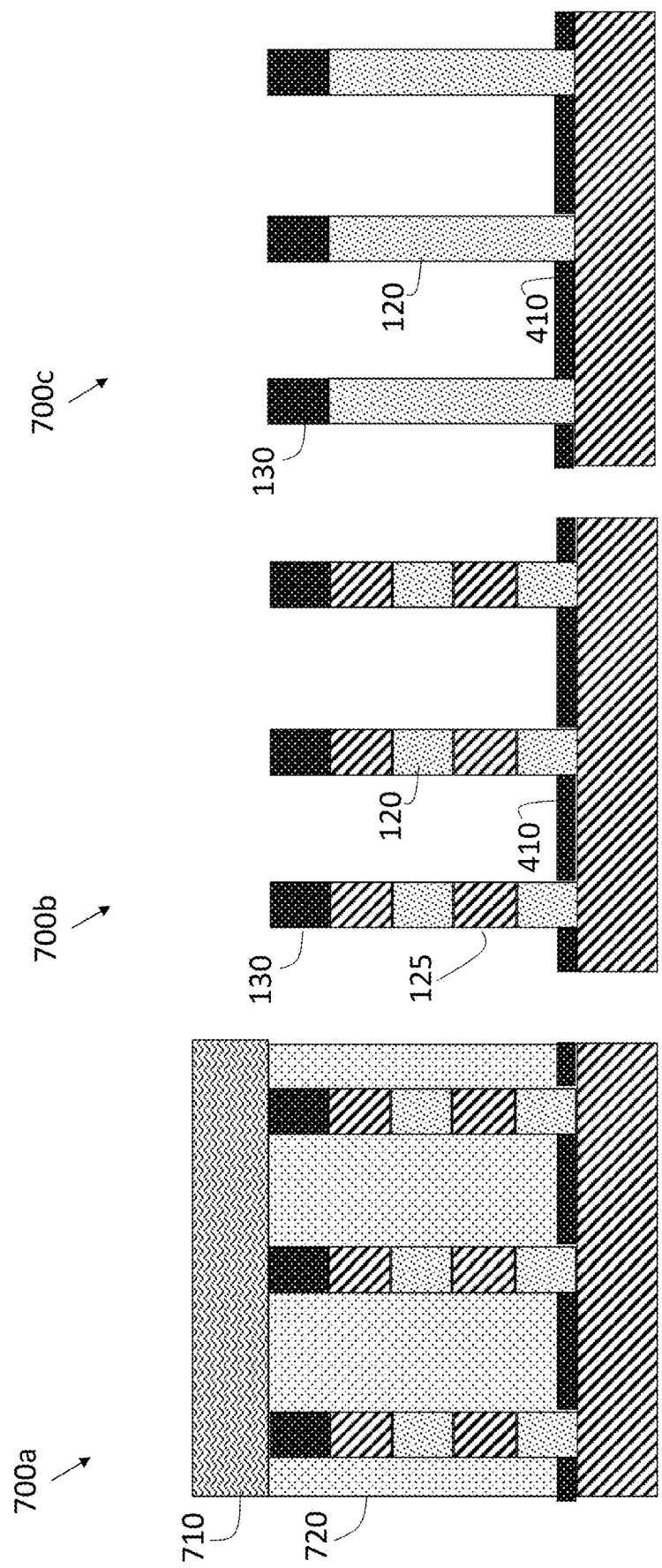

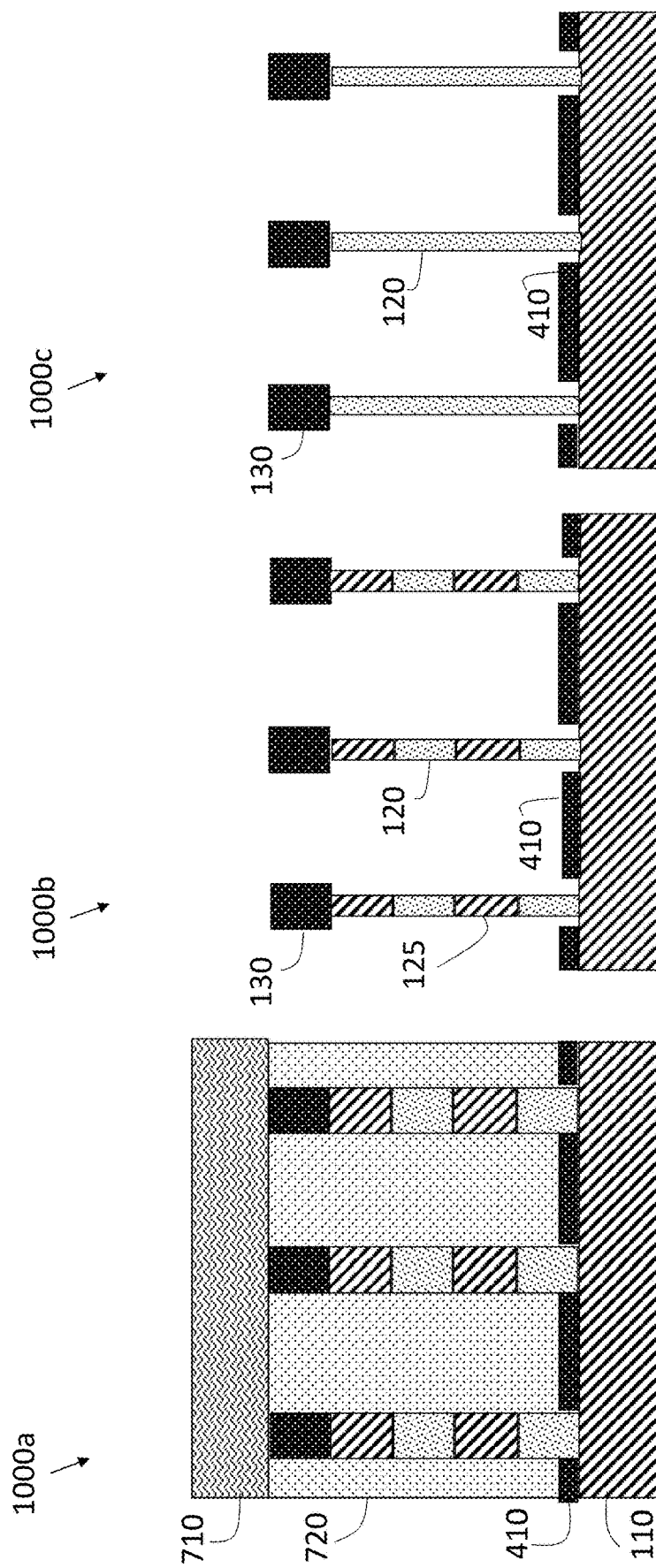

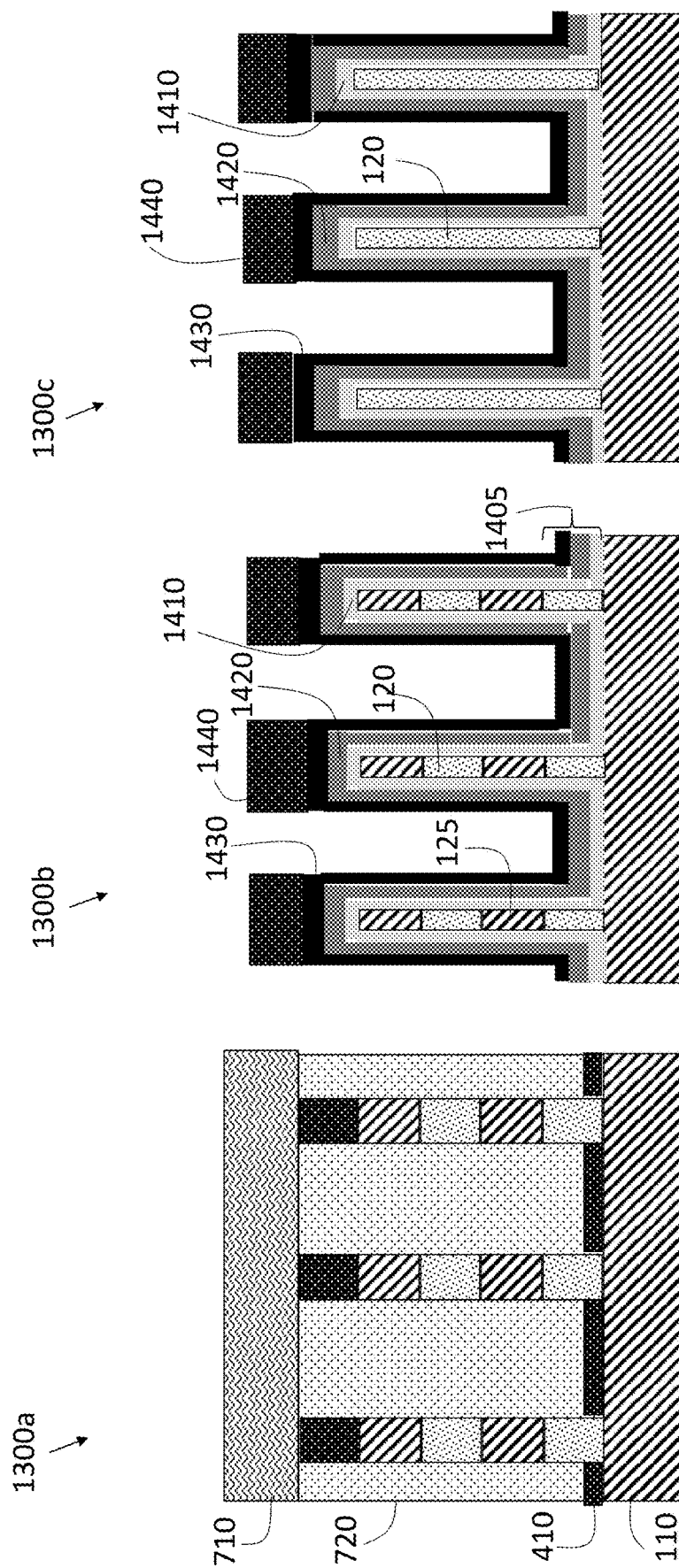

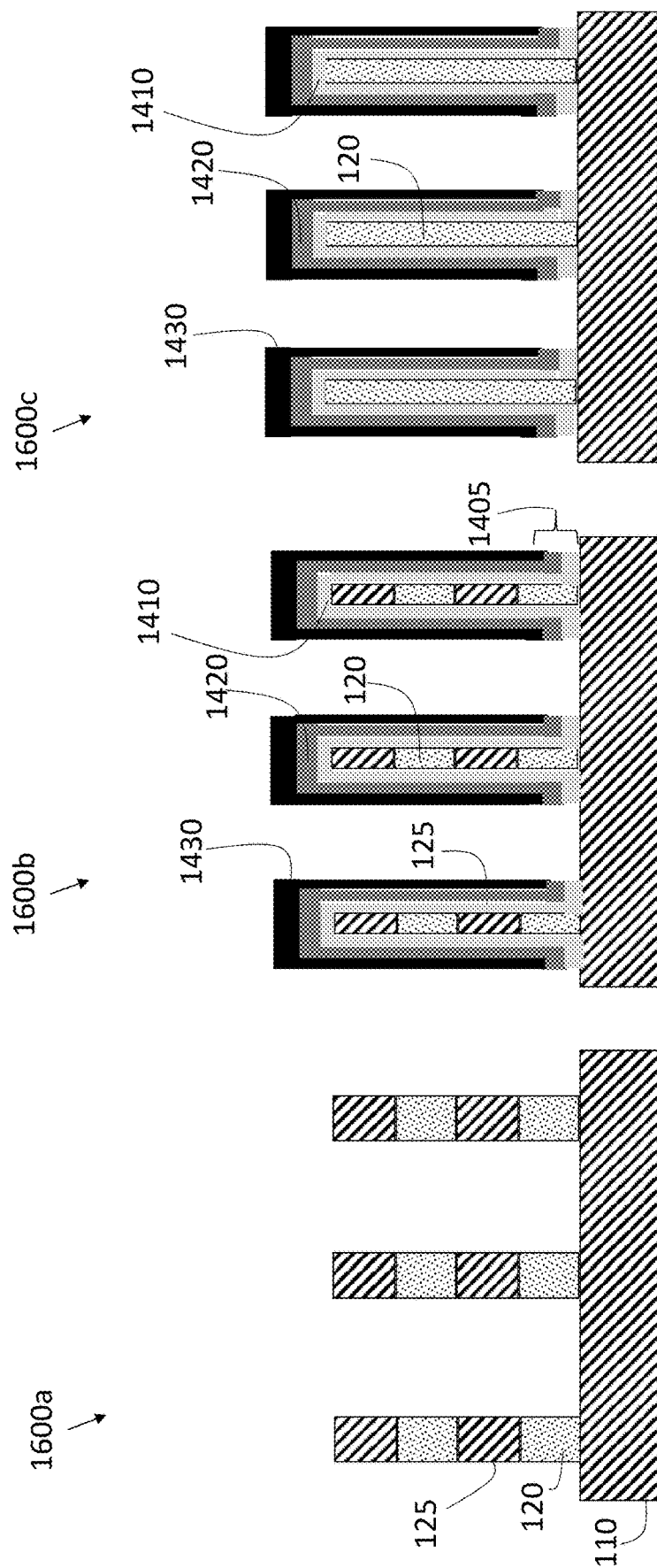

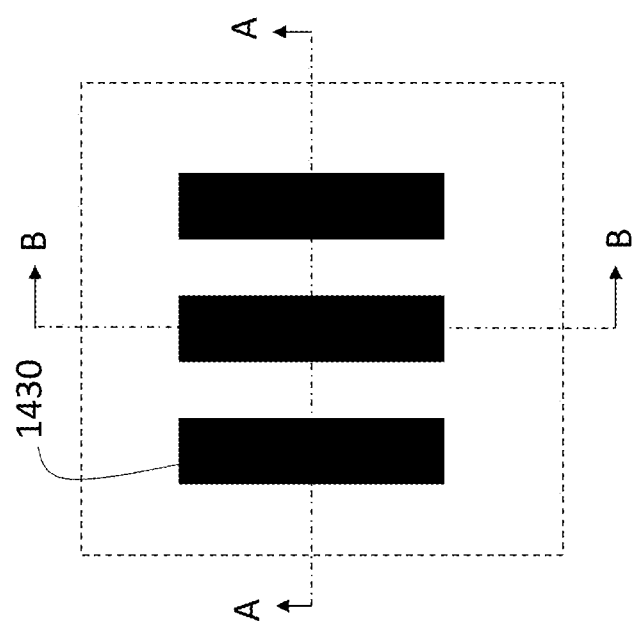

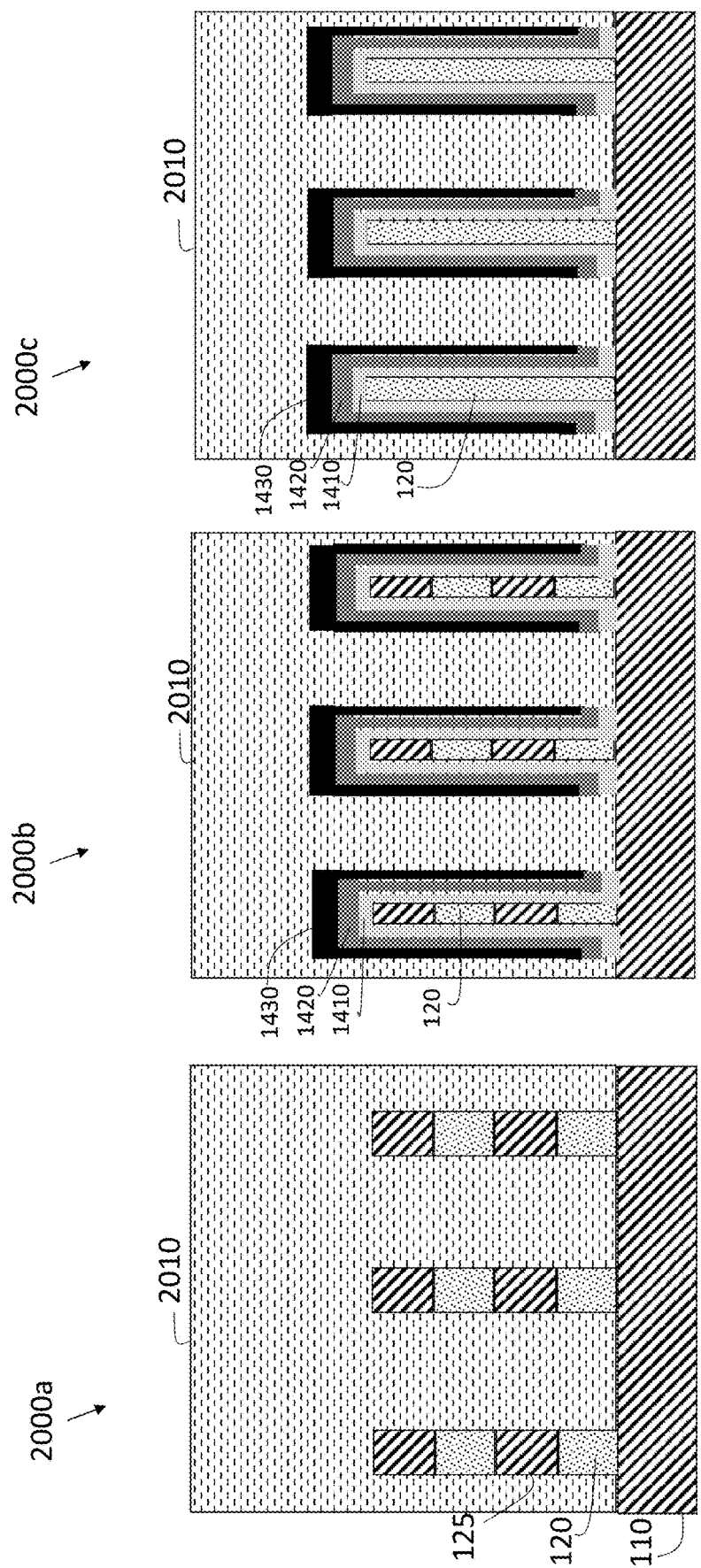

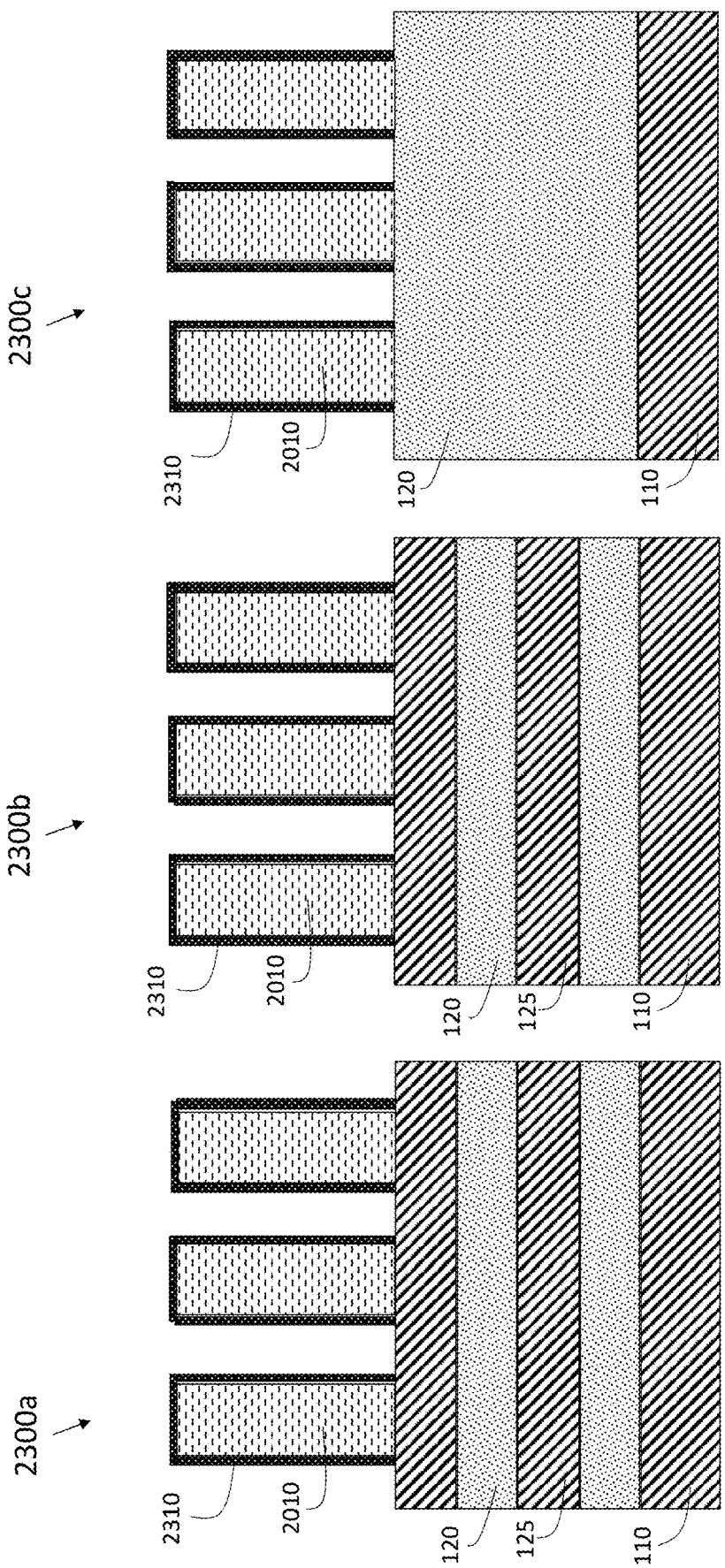

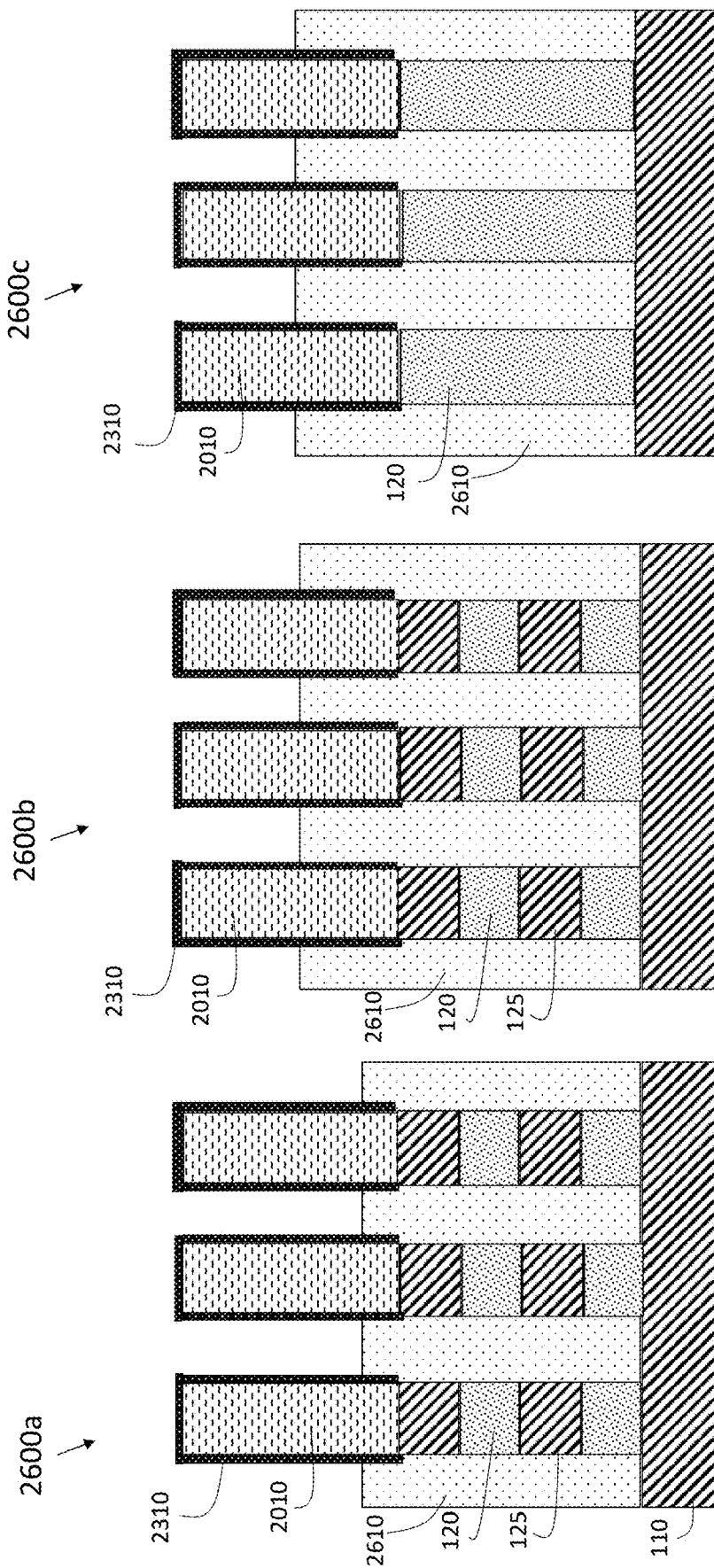

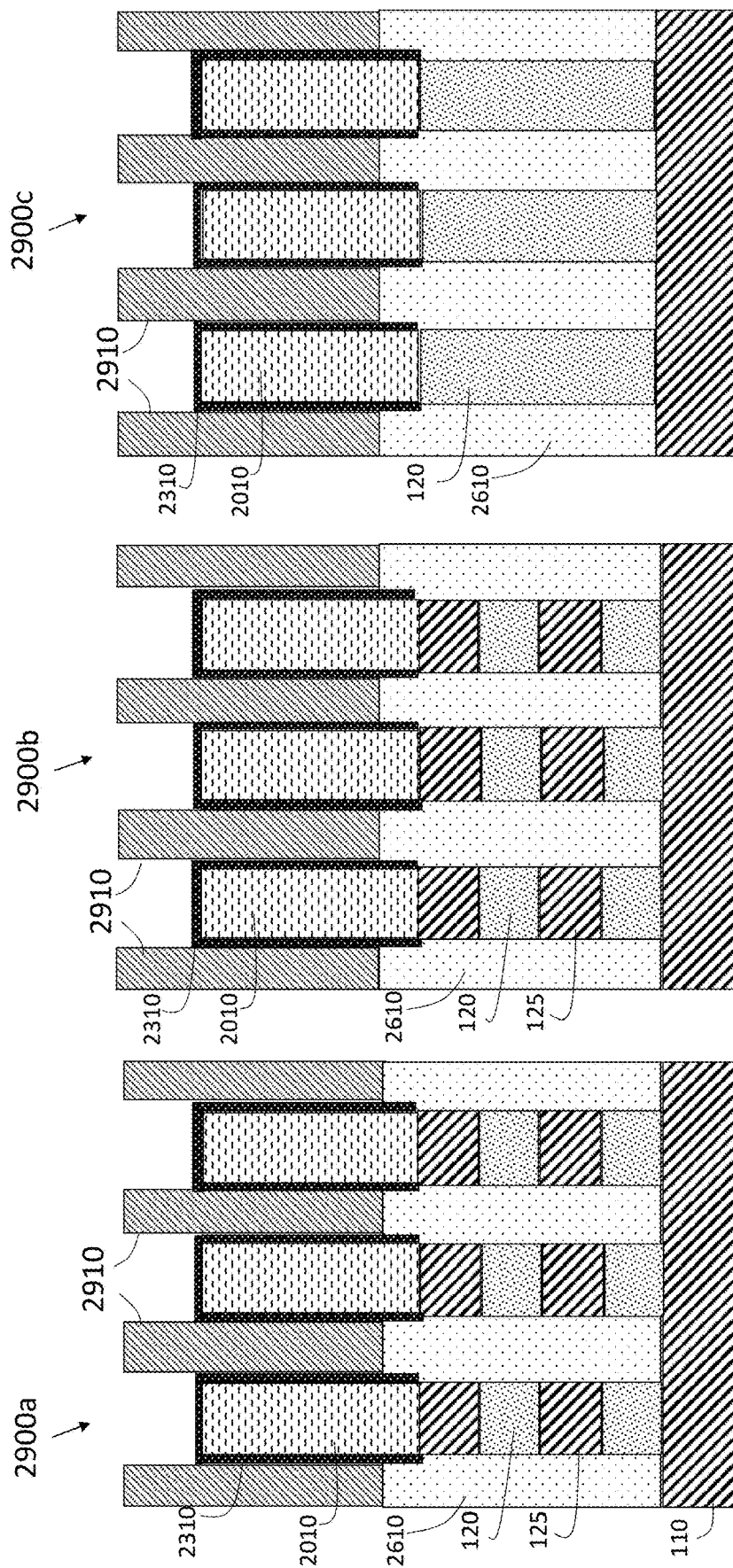

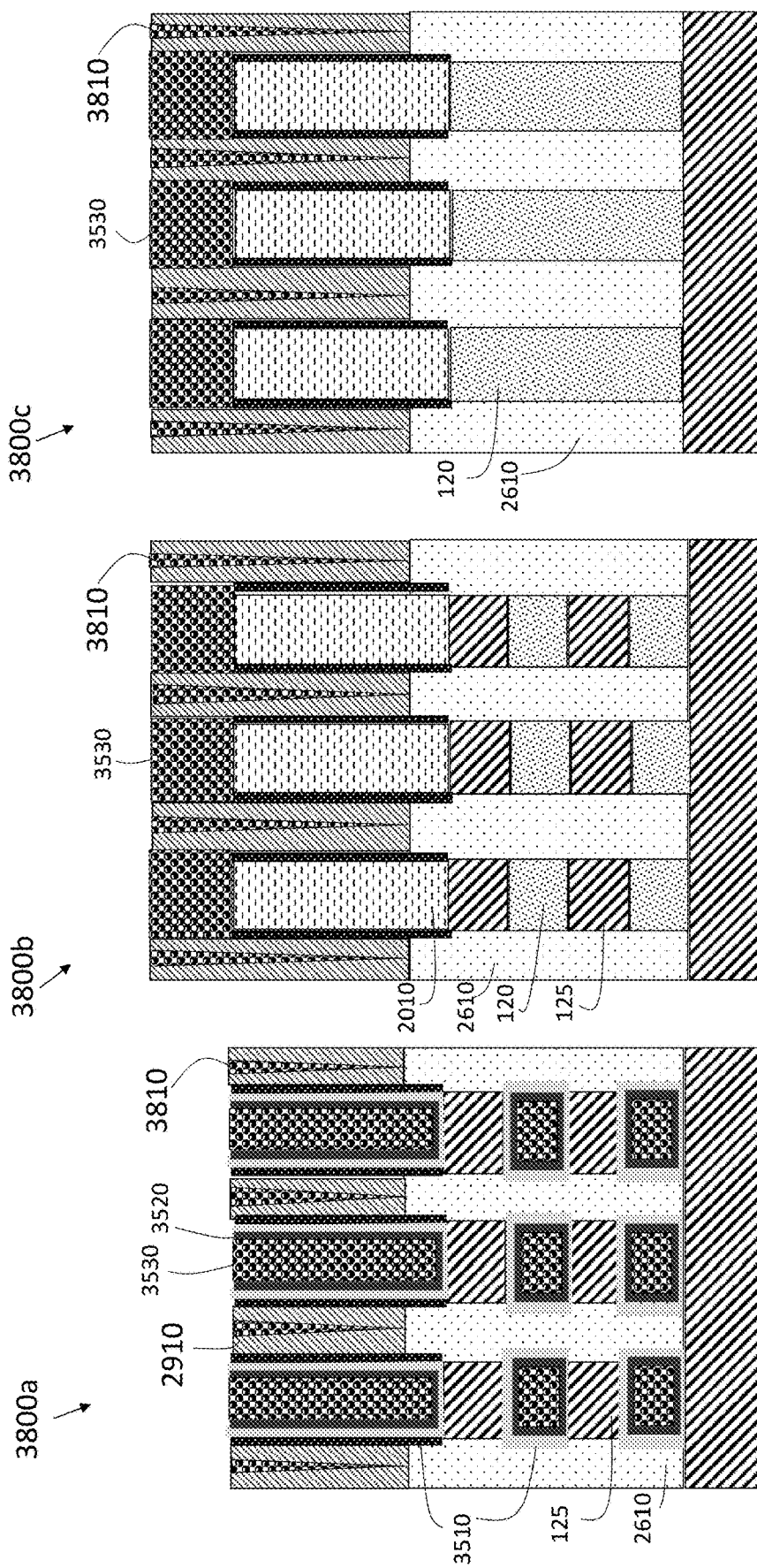

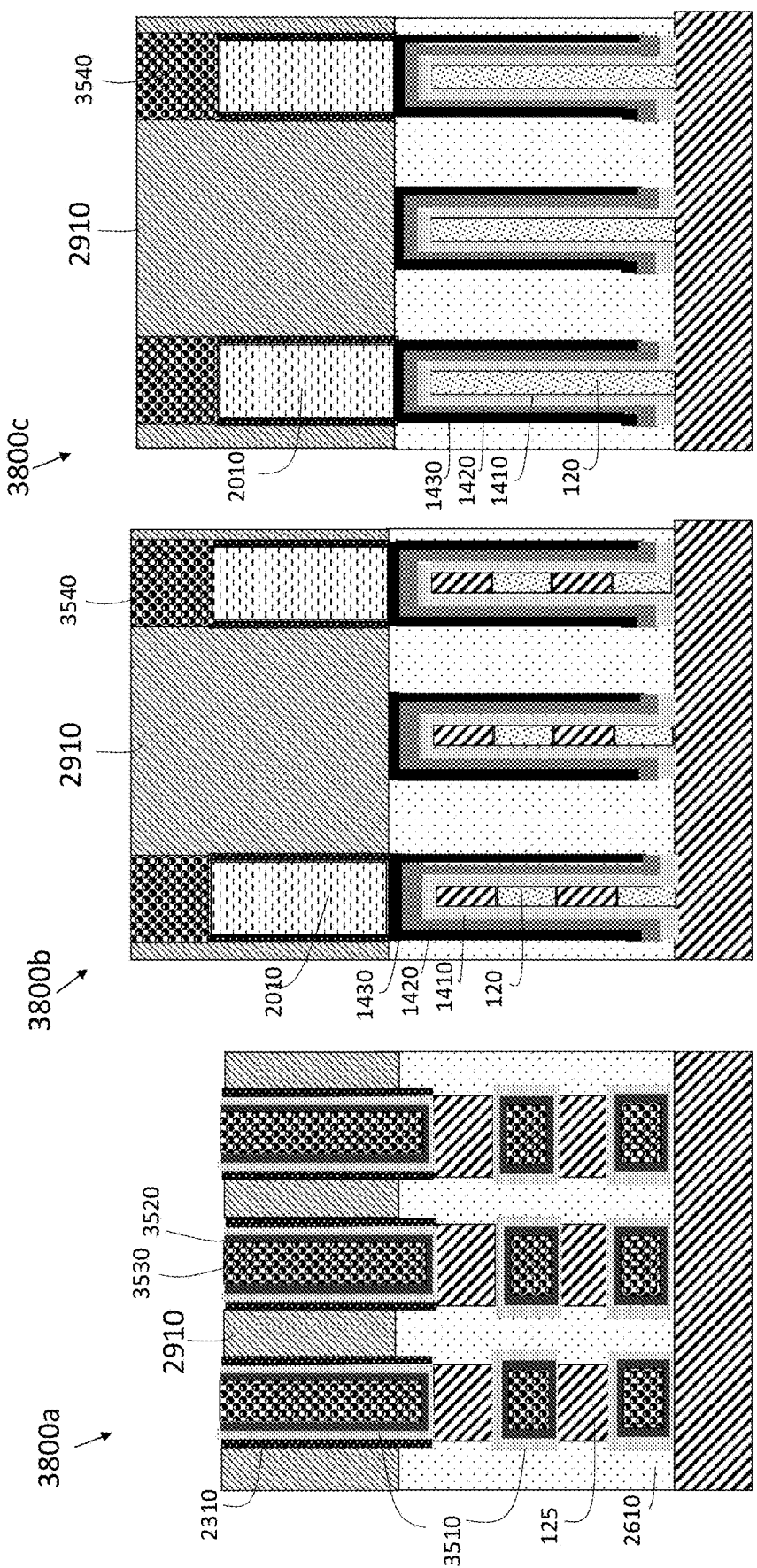

INTEGRATION SCHEME FOR NON-VOLATILE MEMORY ON GATE-ALL-AROUND STRUCTURE

BACKGROUND

The present invention relates to electronic devices with embedded non-volatile memory (NVM), and more specifically, to an integration scheme for NVM on a gate-all-around structure.

Electronic devices with embedded NVM are desirable in mobile and automotive applications, because of their high speed, low power consumption, and reliability. In a nanosheet field effect transistor (nanosheet FET), the channel region between the source and drain regions is defined by horizontal silicon sheets, called nanosheets or a nanosheet stack. A fin FET, which has a channel region defined by a fin, is an example of a tri-gate FET, because the gate contacts three surfaces (top and two sides) of the fin-shaped channel. The nanosheet FET is a gate-all-around (GAA) FET, because the gate contacts all four surfaces of each of the nanosheets in the stack that defines the channel region.

SUMMARY

Embodiments of the present invention are directed to an integrated device including a non-volatile memory (NVM) and a nanosheet field effect transistor (FET) and methods of fabricating the device. The method includes patterning fins for a channel region of the NVM and the nanosheet FET, and depositing an organic planarization layer (OPL) and a block mask to protect the fins for the channel region of the nanosheet FET. The method also includes conformally depositing a set of layers that make up an NVM structure in conjunction with the channel region of the NVM while protecting the fins for the channel region of the nanosheet FET with the OPL and the block mask, and removing the OPL and the block mask protecting the fins for the channel region of the nanosheet FET. Source and drain regions of the NVM and the nanosheet FET are formed, and a gate of the nanosheet FET is formed while protecting the NVM by depositing another OPL and another block mask.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

FIGS. 1-43 show aspects of the process flow of the integrated fabrication of non-volatile memory (NVM) and a nanosheet field effect transistor (FET) according to two or more embodiments of the invention, in which:

FIG. 1 shows a cross-sectional view of an intermediate structure that will form the nanosheet FET;

FIG. 2 shows a cross-sectional view of an intermediate structure that will form the NVM according to a first exemplary embodiment of the invention;

FIG. 3 shows a cross-sectional view of an intermediate structure that will form the NVM according to a second exemplary embodiment of the invention;

FIG. 4 shows the structure shown in FIG. 1 after directional deposition of a spacer material;

FIG. 5 shows the structure shown in FIG. 2 after directional deposition of a spacer material;

FIG. 6 shows the structure shown in FIG. 3 after directional deposition of a spacer material;

FIG. 7 shows the structure that forms the nanosheet FET following the deposition of organic planarization layer (OPL) and a block mask;

FIG. 8 shows that the structure that forms a first exemplary embodiment of the NVM is not affected by the processing of the structure shown in FIG. 7;

FIG. 9 shows that the structure that forms a second exemplary embodiment of the NVM is also not affected by the processing of the structure shown in FIG. 7;

FIG. 10 shows that the structure shown in FIG. 7 is unaffected by an isotropic etch process;

FIG. 11 shows a result of performing an isotropic etch process on the structure shown in FIG. 8;

FIG. 12 shows a result of performing an isotropic etch process on the structure shown in FIG. 9;

FIG. 13 is a cross-sectional view that illustrates that further processing to form the NVM does not affect the structure used to form the nanosheet FET;

FIG. 14 is a cross-sectional view that shows the result of depositing conformal layers on the channel regions and a hardmask above the structure shown in FIG. 11;

FIG. 15 is a cross-sectional view that shows the result of depositing conformal layers on the channel regions and a hardmask above the structure shown in FIG. 12;

FIG. 16 shows the result of removing the block mask and OPL from the structure shown in FIG. 13;

FIG. 17 shows the result of removing the conformal layers in the trenches between the channel regions that include silicon and silicon germanium of the structure shown in FIG. 14;

FIG. 18 shows the result of removing the conformal layers in the trenches between the channel regions of silicon germanium of the structure shown in FIG. 15;

FIG. 19 shows an overhead view used to indicate two different cross-sectional cuts;

FIG. 20 shows the structure shown in FIG. 16 following deposition of a polysilicon gate fill;

FIG. 21 shows the structure shown in FIG. 17 following deposition of a polysilicon gate fill;

FIG. 22 shows the structure shown in FIG. 18 following deposition of a polysilicon gate fill;

FIG. 23 shows a different cross-sectional view of the structure shown in FIG. 20 following gate patterning and a spacer deposition;

FIG. 24 shows a different cross-sectional view of the structure shown in FIG. 21 following gate patterning and a spacer deposition;

FIG. 25 shows a different cross-sectional view of the structure shown in FIG. 22 following gate patterning and a spacer deposition;

FIG. 26 shows the cross-sectional view shown in FIG. 23 following a fin recess and source and drain epitaxy;

FIG. 27 shows the cross-sectional view shown in FIG. 24 following a fin recess and source and drain epitaxy;

FIG. 28 shows the cross-sectional view shown in FIG. 25 following a fin recess and source and drain epitaxy;

FIG. 29 shows the structure in FIG. 26 following an oxide fill and cap dielectric hardmask removal;

FIG. 30 shows the structure in FIG. 27 following an oxide fill and cap dielectric hardmask removal;

FIG. 31 shows the structure in FIG. 28 following an oxide fill and cap dielectric hardmask removal;

FIG. 32 shows recess of the oxide fill in the structure shown in FIG. 29;

FIG. 33 shows the formation of OPL and a block mask on the structure shown in FIG. 30;

FIG. 34 shows the formation of OPL and a block mask on the structure shown in FIG. 31;

FIG. 35 shows a cross-sectional view of the structure used to form the nanosheet FET following the formation of the replacement gate;

FIG. 36 shows the structure of FIG. 33 following removal of the block mask and replacement of the OPL with the gate metal;

FIG. 37 shows the structure of FIG. 34 following removal of the block mask and replacement of the OPL with the gate metal;

FIG. 38 shows one cross-sectional view of the nanosheet FET following the formation of the source and drain contacts;

FIG. 39 shows one cross-sectional view of the NVM according to the first exemplary embodiment that shows the contacts;

FIG. 40 shows one cross-sectional view of the NVM according to the second exemplary embodiment that shows the contacts;

FIG. 41 is another cross-sectional view of the nanosheet FET shown in FIG. 38;

FIG. 42 is another cross-sectional view of the NVM shown in FIG. 39; and

FIG. 43 is another cross-sectional view of the NVM shown in FIG. 40.

DETAILED DESCRIPTION

It is understood in advance that although this invention includes a detailed description of exemplary gate-all-around (GAA) nanosheet FET architectures having silicon (Si) channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by incorporating n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling CMOS technology down to seven (7) nanometer node and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. Some of these challenges apply, as well, to other types of FETs (e.g., fin FETs, nanowire FETs). For example, as previously noted, it can be desirable to embed NVM in electronic devices. Currently, NVM technologies are combined in a back end of line (BEOL) process. That is, after the nanosheet FET is formed, additional layers are added to form the NVM. This can lead to performance degradation due to thermal budget limitation, high power consumption, and oxidization.

Turning now to an overview of aspects of the invention, embodiments of the invention address the above-noted shortcomings of the prior art by implementing an integration scheme for NVM on a GAA structure. A front end of line (FEOL) process is used to form the NVM such that the nanosheet FET and NVM are processed together. Specifically, processing of a depleted polysilicon-oxide-nitride-oxide-silicon (SONOS)-type NVM is integrated on the same wafer as a nanosheet FET device. The SONOS-type flash memory exhibits improved data retention over other technologies like floating gate devices. Two different exemplary embodiments of the invention are specifically discussed, one that involves an NVM with a SiGe channel and one that involves an NVM with a Si channel.

FIGS. 1-43 illustrate aspects of the integration scheme for NVM on a gate-all-around structure according to one or more embodiments of the invention. FIG. 1 shows a cross-sectional view of an intermediate structure 100a in the formation of a nanosheet FET. FIG. 2 shows a cross-sectional view of an intermediate structure 100b in the formation of an NVM according to an exemplary embodiment of the invention. FIG. 3 shows a cross-sectional view of an intermediate structure 100c in the formation of an NVM according to a different exemplary embodiment of the invention. The intermediate structures 100a and 100b or 100a and 100c are formed at the same time according to the integration scheme implemented according to embodiments of the invention. The structures 100a and 100b are the same. Fins of alternating SiGe 120 and Si 125 are formed on a substrate 110, and a hardmask 130 (e.g., silicon nitride (SiN)) is formed on the fins. The number of SiGe 120 and Si 125 portions and their relative thicknesses are not limited by the example shown in the figures. The structure 100c has fins of only SiGe 120 with the hardmask 130 deposited above.

The substrate 110 can include a bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 110 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 110 can also comprise an organic semiconductor or a layered semiconductor such as, for example, Si/SiGe, a silicon-on-insulator or a SiGe-on-insulator. A portion or entire semiconductor substrate 110 can be amorphous, polycrystalline, or monocrystalline. In addition to the aforementioned types of semiconductor substrates 110, the substrate 410 can also comprise a hybrid oriented (HOT) semiconductor substrate in which the HOT substrate has surface regions of different crystallographic orientation. The substrate 110 can be doped, undoped, or contain doped regions and undoped regions therein. The substrate 110 can contain regions with strain and regions without strain therein, or contain regions of tensile strain and compressive strain. In one or more embodiments, the substrate 110 can be a semiconductor-on-insulator (SOI) substrate. The substrate 110 can further include other structures (not shown) such as shallow trench isolation (STI), fins, nanowires, nanosheets, resistors, capacitors, etc.

FIGS. 4-6 show cross-sectional views of structures 400a, 400b, 400c, respectively, that result from directional deposition of a bottom spacer 410 on the structures 100a, 100b, 100c. The bottom spacer 410 can be SiN. FIG. 7 shows the structure 700a that results from the deposition of a block mask 710 and an organic planarization layer (OPL) 720 over the structure 400a that will ultimately form the nanosheet FET. FIGS. 8 and 9 respectively show the structures 700b and 700c which are unchanged from structures 400b and 400c in FIGS. 5 and 6. The block mask 710 protects the structure 400a, shown in FIG. 4, which is used to form the nanosheet FET while the NVM is formed based on further processing of the structure 700b, according to one exemplary embodiment of the invention, or further processing of the structure 700c, according to another exemplary embodiment of the invention.

FIG. 10 shows the structure 1000a that results from an isotropic etch back process. As a comparison of FIGS. 7 and 10 indicates, the isotropic etch does not affect the structure 700a, which is protected by the block mask 710. FIGS. 11 and 12 respectively show structures 1000b and 1000c that result from the same isotropic etch back process that results in the structure 1000a. FIG. 11 shows the intermediate structure 1000b that results in the NVM according to one exemplary embodiment and FIG. 12 shows the intermediate structure 1000c that results in the NVM according to another exemplary embodiment. In structure 1000b, the fins of alternating Si 125 and SiGe 120 are etched back, as shown. In structure 1000c, the fins of SiGe 120 are etched back, as shown.

FIG. 13 shows the structure 1300a, which is unchanged from the structure 1000a in FIG. 12. FIGS. 14 and 15 respectively show the structures 1300b and 1300c that result from a set of processes. The processes include removal of the hardmask 130 and conformal deposition of tunnel layer 1410 (e.g., silicon oxide-nitride (SiON)), a trapping layer 1420 (e.g., hafnium oxide ($HfO_2$) or other high-k material), and a blocking layer 1430 (e.g., silicon dioxide ($SiO_2$)). The tunnel layer 1410, trapping layer 1420, and block layer 1430 can be referred to together as the NVM stack 1405. The conformal depositions are followed by directional deposition of another hardmask 1440 (e.g., SiN). As previously noted, the block mask 710 on the structure 1000a ensures that none of these processes has an effect on the structure 1300a.

FIG. 16 shows the structure 1600a that results from removal of the block mask 710 and OPL 720. The bottom spacer 410 is also removed. As a result, only the substrate 110 and the fins of alternating SiGe 120 and Si 125 remain in the intermediate structure 1600a that will ultimately form the nanosheet FET. FIGS. 17 and 18 respectively show the structures 1600b and 1600c that result from removal of the NVM stack 1405 in the trench between the fins of SiGe 120 and Si 125, in the case of structure 1600b, and between the fins of SiGe 120, in the case of structure 1600c. A directional plasma reactive ion etch (RIE) process is used to remove the NVM stack 1405 in the trenches. The hardmask 1440 is also removed from the structures 1400b and 1400c shown, respectively, in FIGS. 14 and 15.

FIG. 19 shows an overhead view of the structure 1400b shown in FIG. 14. The overhead view is the same as for the structure 1400c shown in FIG. 15 and is also representative of the structure 1400a shown in FIG. 13. Two cross-sections are indicated in FIG. 19. The cross-section A-A is across the fins, as indicated. In the case of the structures 1400a and 1400b, the fins are made up of alternating SiGe 120 and Si 125. In the case of the structure 1400c, the fins are made up of SiGe 120. The cross-section B-B is along a fin, as indicated.

FIG. 20 shows a cross-sectional view across the fins (cross-section A-A indicated in FIG. 19) of a structure 2000a that results from the deposition of a dummy polysilicon gate fill 2010 followed by a chemical mechanical planarization (CMP) process. The dummy polysilicon gate fill 2010 is deposited on the structure 1600a shown in FIG. 16 to result in the structure 2000a. FIGS. 21 and 22 respectively show cross-sectional views of structures 2000b and 2000c. The structure 2000b results from the deposition of the dummy polysilicon gate fill 2010 on the structure 1600b shown in FIG. 17, which will form the NVM according to an exemplary embodiment of the invention. The structure 2000c results from the deposition of the dummy polysilicon gate fill 2010 on the structure 1600c shown in FIG. 18, which will form the NVM according to another exemplary embodiment of the invention.

FIGS. 23, 24, and 25 show cross-sectional views along a fin (cross-section B-B indicated in FIG. 19). FIG. 23 shows a cross-sectional view of a structure 2300a that will form the nanosheet FET, while FIGS. 24 and 25 respectively show cross-sectional views of structures 2300b and 2300c that will form NVMs according to alternate embodiments of the invention. In each of the structures 2300a, 2300b, 2300c, the dummy polysilicon gate fill 2010 is patterned into fins and a hardmask spacer 2310 is formed, as shown. The spacer 2310 can be SiN, for example.

FIGS. 26, 27, and 28 show cross-sectional views along a fin (cross-section B-B indicated in FIG. 19). The figures show structures 2600a, 2600b, 2600c that result from a fin recess followed by source and drain epitaxy. Specifically, source or drain material 2610 is deposited, and that source or drain material 2610 can be Si:boron (B) or SiGe:B in a p-type FET or Si:phosphorous (P) or SiGe:P in an n-type FET, for example. FIGS. 29, 30, and 31 show cross-sectional views of structures 2900a, 2900b, and 2900c, respectively. The structures 2900a, 2900b, 2900c result from a fill with oxide 2910 between the dummy polysilicon gate fill 2010 and, more specifically, between the spacers 2310. The oxide 2910 can be flowable oxide (FOX) and SiO2. A CMP process is performed after the deposition of the oxide 2910. This CMP process lands on and removes the material of the spacer 2310 that is on top of the dummy polysilicon gate fill 2010 (i.e., the cap dielectric hardmask).

FIG. 32 shows a cross-sectional view of a structure 3200a that forms the nanosheet FET. The oxide 2910 is recessed, as shown. FIGS. 33 and 34 show cross-sectional views, respectively, of structures 3200b, 3200c that form the NVM according to alternate embodiments. Both structures 3200b and 3200c include a block mask 3320 and an OPL 3310. The block mask 3320 and OPL 3310 protect the underlying structures during further processing of the structure 3200a to replace the dummy polysilicon gate fill 2010 with the gate, as discussed with reference to FIG. 35.

FIG. 35 shows a cross-sectional view of a structure 3500a that is formed into the nanosheet FET. The cross-sectional view shown in FIG. 35 is along a fin (cross-section B-B as indicated in FIG. 19). A polygate pull is performed to remove the dummy polysilicon gate fill 2010. The SiGe 120, shown in FIG. 32, for example, is fully released. This is followed by depositions of a high-k dielectric 3510, and a workfunction metal 3520. A gate fill 3530 is then performed followed by a CMP process. The gate fill 3530 can be tungsten (W), for example. FIGS. 36 and 37 respectively show structures 3500b and 3500c, which are used to form NVM devices according to alternate embodiments of the invention. Like the structure 3500a, the structures 3500b and 3500c are shown as cross-sectional views along a fin (cross-section B-B as indicated in FIG. 19). The block mask 3320 and the OPL 3310 are removed following the deposition of the high-k dielectric 3510 and workfunction metal 3520 but prior to deposition of the gate fill 3530. Thus, the gate fill 3530 and subsequent CMP process are reflected in the structures 3500b and 3500c, as shown.

FIG. 38 shows a cross-sectional view of a structure 3800a that is the nanosheet FET. The cross-sectional view shown in FIG. 38 is along a fin (cross-section B-B as indicated in FIG. 19). Contacts 3810 are patterned and filled to the source or drain material 2610 below. The metal fill of the contacts 3810 can be W. FIGS. 39 and 40 respectively show structures 3800b and 3800c, which are essentially NVM devices according to alternate embodiments of the invention. The structures 3800b and 3800c include contacts 3910, as shown.

FIG. 41 shows a different cross-sectional view of the structure 3800a of the nanosheet FET than the view shown in FIG. 38. The cross-sectional view shown in FIG. 41 is across the fins (cross-section A-A as indicated in FIG. 19). FIGS. 42 and 43 show different cross-sectional views of the respective structures 3800b and 3800c than those shown in FIGS. 39 and 40. The cross-sectional views in FIGS. 42 and 43 are across the fins. FIG. 42 shows a different cross-sectional view of the NVM structure 3800b shown in FIG. 39, and FIG. 43 shows a different cross-sectional view of the NVM structure 3800c shown in FIG. 40.

FIGS. 42 and 43 show that the NVM according to each of the exemplary embodiments is a SONOS-type flash memory. Specifically, the SONOS layers include polysilicon gate fill 2010 (S), blocking layer 1430 such as $SiO_2$ (O), tunnel layer 1410 such as SiON (NO), and the channel SiGe 120 or Si 125 (S). Specifically, the conformal layers (i.e., the NVM stack 1405) around the channel are the "ONO" in the SONOS structure of the NVM. Based on the high-k trapping layer 1420, the NVM according to the embodiments is a further variant of the SONOS-type flash memory referred to as SHINOS (silicon, high-k, nitride, oxide, silicon). That is, polysilicon gate fill 2010 (S), trapping layer 1420 such as $HfO_2$ (HI), tunnel layer 1410 such as SiON (NO), and the channel SiGe 120 or Si 125 (S).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of performing integrated fabrication of a non-volatile memory (NVM) and a nanosheet field effect transistor (FET), the method comprising:

patterning fins for a channel region of the NVM and the nanosheet FET;

depositing an organic planarization layer (OPL) and a block mask to protect the fins for the channel region of the nanosheet FET;

conformally depositing a set of layers that make up an NVM structure in conjunction with the channel region of the NVM while protecting the fins for the channel region of the nanosheet FET with the OPL and the block mask;

removing the OPL and the block mask protecting the fins for the channel region of the nanosheet FET;

forming source and drain regions of the NVM and the nanosheet FET; and forming a gate of the nanosheet FET while protecting the NVM by depositing another OPL and another block mask.

2. The method according to claim 1, wherein the depositing the set of layers that make up the NVM structure includes conformally depositing silicon oxide nitride directly on the fins for the channel region of the NVM.

3. The method according to claim 2, wherein the depositing the set of layers that make up the NVM structure includes conformally depositing hafnium dioxide on the silicon oxide nitride.

4. The method according to claim 3, wherein the depositing the set of layers that make up the NVM structure includes conformally depositing silicon dioxide on the hafnium dioxide.

5. The method according to claim 1, wherein the patterning the fins for the channel region of the NVM includes patterning alternating silicon and silicon germanium layers.

6. The method according to claim 1, wherein the patterning the fins for the channel region of the NVM includes patterning a silicon germanium layer.

7. The method according to claim 1, further comprising performing an isotropic etch of the fins for the channel region of the NVM following the depositing the OPL and the block mask to protect the fins for the channel region of the nanosheet FET and prior to the conformally depositing the set of layers that make up the NVM structure.

8. The method according to claim 1, further comprising forming contacts to the source and drain regions of the NVM and the nanosheet FET.

9. The method according to claim 1, further comprising patterning polysilicon above the channel region of the NVM, wherein the polysilicon is part of the NVM structure along with silicon in the channel region of the NVM.

10. The method according to claim 9, further comprising forming contacts to the polysilicon.

* * * * *